(12) United States Patent
Cheng (10) Patent No.: US 10,381,384 B2
(45) Date of Patent: Aug. 13, 2019

(54) ARRAY SUBSTRATE, METHOD FOR MANUFACTURING ARRAY SUBSTRATE, DISPLAY PANEL AND DISPLAY DEVICE

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 15/688,304

(22) Filed: Aug. 28, 2017

(65) Prior Publication Data

US 2018/0197883 A1 Jul. 12, 2018

(30) Foreign Application Priority Data

Jan. 10, 2017 (CN) .................... 2017 2 0036655 U (51) Int. Cl.
*H01L 27/14* (2006.01)
*H01L 27/12* (2006.01)
*G02F 1/1362* (2006.01)

(52) U.S. Cl.
CPC ...... *H01L 27/124* (2013.01); *G02F 1/136286* (2013.01); *H01L 27/1255* (2013.01); *G02F 1/136227* (2013.01); *G02F 2001/136218* (2013.01); *G02F 2201/121* (2013.01)

(58) Field of Classification Search
CPC ......... G02F 1/136277; G02F 1/136286; H01L 27/124; H01L 27/1255
USPC ............................................. 257/59, 72, 432
See application file for complete search history.

(56) References Cited

U.S. PATENT DOCUMENTS

| | | | | |
|---|---|---|---|---|
| 2002/0118330 | A1* | 8/2002 | Lee | G02F 1/134363 349/141 |
| 2002/0176043 | A1* | 11/2002 | Fukami | G02F 1/134363 349/141 |
| 2005/0127359 | A1* | 6/2005 | Son | G02F 1/134363 257/59 |
| 2007/0296901 | A1* | 12/2007 | Seo | G02F 1/134363 349/141 |
| 2010/0220254 | A1* | 9/2010 | Liu | H01L 33/08 349/46 |
| 2010/0231834 | A1* | 9/2010 | Wang | H01L 29/78633 349/110 |
| 2011/0096051 | A1* | 4/2011 | Huangfu | G02F 1/136213 345/211 |

(Continued)

*Primary Examiner* — Tan N Tran
(74) *Attorney, Agent, or Firm* — Brooks Kushman P.C.

(57) ABSTRACT

An array substrate is provided, which includes: a base substrate; a plurality of gate lines, a plurality of data lines and a plurality of common electrode lines arranged on the base substrate; a pixel electrode arranged at each region defined by adjacent gate lines and adjacent data lines; and a TFT arranged at a position in proximity to a junction between each of the gate lines and the corresponding data line. A drain electrode of the TFT is electrically connected to the pixel electrode through a via-hole. Each common electrode line includes a primary electrode line extending in a direction identical to an extension direction of the gate line, and a secondary electrode line connected vertically to the primary electrode line. The secondary electrode line includes at least one first secondary electrode line arranged between the via-hole and the data line.

20 Claims, 5 Drawing Sheets

(56) References Cited

U.S. PATENT DOCUMENTS

| | | | |
|---|---|---|---|
| 2012/0099041 A1* | 4/2012 | Xie | G02F 1/1343 |
| | | | 349/42 |
| 2014/0061818 A1* | 3/2014 | Zhang | G02F 1/136286 |
| | | | 257/390 |
| 2015/0200206 A1* | 7/2015 | Liu | G02F 1/136286 |
| | | | 257/72 |
| 2016/0005766 A1* | 1/2016 | Choi | H01L 27/124 |
| | | | 257/72 |
| 2016/0027808 A1* | 1/2016 | Kim | H01L 27/1225 |
| | | | 349/43 |
| 2016/0109772 A1* | 4/2016 | Kim | G02F 1/133377 |
| | | | 349/46 |
| 2016/0197098 A1* | 7/2016 | Xian | H01L 27/1222 |
| | | | 257/72 |

* cited by examiner

ARRAY SUBSTRATE, METHOD FOR MANUFACTURING ARRAY SUBSTRATE, DISPLAY PANEL AND DISPLAY DEVICE

CROSS-REFERENCE TO RELATED APPLICATION

This application claims priority to Chinese patent application No. 201720036655.3 filed on Jan. 10, 2017, which is incorporated herein by reference in its entirety.

TECHNICAL FIELD

The present disclosure relates to the field of display technology, in particular to an array substrate, a method for manufacturing the array substrate, a display panel and a display device.

BACKGROUND

Liquid Crystal Display (LCD) technology, as the most widely used display technology nowadays, has been widely applied to various areas such as televisions, mobile phones and the display of public information. A high display quality is an essential factor for the success of the LCD.

Usually, a liquid crystal display panel includes an array substrate, an opposite substrate arranged opposite to the array substrate to form a cell, and a liquid crystal layer arranged therebetween. Generally, in related art, the array substrate includes a plurality of gate lines and a plurality of data lines crossing the gate lines. A thin film transistor (TFT) is arranged at a position in proximity to a junction between each of the gate lines and the corresponding data line. A pixel unit is defined by two adjacent gate lines and two adjacent data lines, and a pixel electrode is arranged at a region where the pixel unit is located. A source electrode of the TFT is electrically connected to the data line, and a drain electrode thereof is electrically connected to a connection portion of the pixel electrode. However, a signal from the data line may interfere with a voltage across the pixel electrode, and thereby the display quality may be adversely affected.

Hence, there is an urgent need to provide a scheme to prevent the signal from the data line from interfering with the voltage across the pixel electrode.

SUMMARY

An object of the present disclosure is to provide an array substrate, a method for manufacturing the array substrate, a display panel and a display device.

In one aspect, the present disclosure provides in some embodiments an array substrate, comprising: a base substrate; a plurality of gate lines, a plurality of data lines and a plurality of common electrode lines arranged on the base substrate; a pixel electrode arranged at each region defined by adjacent gate lines and adjacent data lines; and a TFT arranged at a position in proximity to a junction between each of the gate lines and the corresponding data line, wherein a drain electrode of the TFT is electrically connected to the pixel electrode through a via-hole. Each of the common electrode lines comprises a primary electrode line extending in a direction identical to an extension direction of the gate line, and a secondary electrode line connected vertically to the primary electrode line. The secondary electrode line comprises at least one first secondary electrode line arranged between the via-hole and the data line. The via-hole is arranged between the primary electrode line and the gate line.

In a possible embodiment of the present disclosure, in the array substrate, the first secondary electrode line is arranged between the via-hole and a data line nearest to one side of the via-hole; and/or the first secondary electrode line is arranged between the via-hole and a data line which is at another side of the via-hole and opposite to the data line nearest to the one side of the via-hole.

In a possible embodiment of the present disclosure, in the array substrate, the first secondary electrode line extends in a direction identical to an extension direction of the data line.

In a possible embodiment of the present disclosure, in the array substrate, the first secondary electrode line has a length greater than a distance between a center of the via-hole and the primary electrode line.

In a possible embodiment of the present disclosure, in the array substrate, in the case that there are two first secondary electrode lines, the two first secondary electrode lines are arranged at two sides of the via-hole respectively, and a distance between one of the two first secondary electrode lines and the center of the via-hole is equal to a distance between the other one of the first secondary electrode lines and the center of the via-hole.

In a possible embodiment of the present disclosure, in the array substrate, the secondary electrode line further comprises at least one second secondary electrode line arranged at an edge region of the pixel electrode, and the second secondary electrode line and the first secondary electrode line are arranged at two sides of the primary electrode line respectively In a possible embodiment of the present disclosure, in the array substrate, the second secondary electrode line and the first secondary electrode line are arranged parallel to each other or in an identical straight line.

In a possible embodiment of the present disclosure, in the array substrate, the primary electrode line and the secondary electrode line are formed integrally.

In another aspect, the present disclosure provides in some embodiments a display panel including the above-mentioned array substrate.

In yet another aspect, the present disclosure provides in some embodiments a display device including the above-mentioned display panel.

In still yet another aspect, the present disclosure provides in some embodiments a method for manufacturing the above-mentioned array substrate, including steps of: forming a pattern of the gate lines, gate electrodes and the common electrode lines on the base substrate through a single patterning process, each of the common electrode lines comprising the primary electrode line extending in the direction identical to the extension direction of the gate line and the secondary electrode line connected vertically to the primary electrode line; forming a gate insulation layer on the base substrate on which the pattern of the gate lines, the gate electrodes and the common electrode lines have been formed; forming a pattern of an active layer on the gate insulation layer; forming a pattern of the data lines, source electrodes and the drain electrodes on the base substrate on which the pattern of the active layer has been formed; forming a pattern of a passivation layer and the via-holes on the base substrate on which the pattern of the data lines, the source electrodes and the drain electrodes have been formed; and forming a pattern of the pixel electrodes on the passivation layer and the via-holes.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

A thickness and a shape of each layer in the drawings are for illustrative purposes only, but shall not be used to reflect an actual scale.

The present disclosure provides in some embodiments an array substrate which, as shown in FIGS. 1 to 4, includes: a base substrate 100; a plurality of gate lines 1, a plurality of data lines 2 and a plurality of common electrode lines 3 arranged on the base substrate 100; a pixel electrode 4 arranged at each region defined by two adjacent gate lines 1 and two adjacent data lines 2; and a TFT (including a gate electrode 5, a source electrode 6 and a drain electrode 7 as shown in the figures) arranged at a position in proximity to a junction between each of the gate lines 1 and the corresponding data line 2. The drain electrode 7 of the TFT is electrically connected to the pixel electrode 4 through a via-hole 8 (as shown in these figures, the drain electrode 7 of the TFT is electrically connected to a connection portion 41 of the pixel electrode 4 through the via-hole 8). Each of the common electrode lines 3 includes a primary electrode line 31 extending in a direction identical to an extension direction of the gate line 1, and a secondary electrode line connected vertically to the primary electrode line 31. The secondary electrode line includes at least one first secondary electrode line 32 (indicated by the dotted circle in the figures) arranged between the via-hole 8 and the data line 2. The via-hole 8 is arranged between the primary electrode line 31 and the gate line 1.

Figure 1:
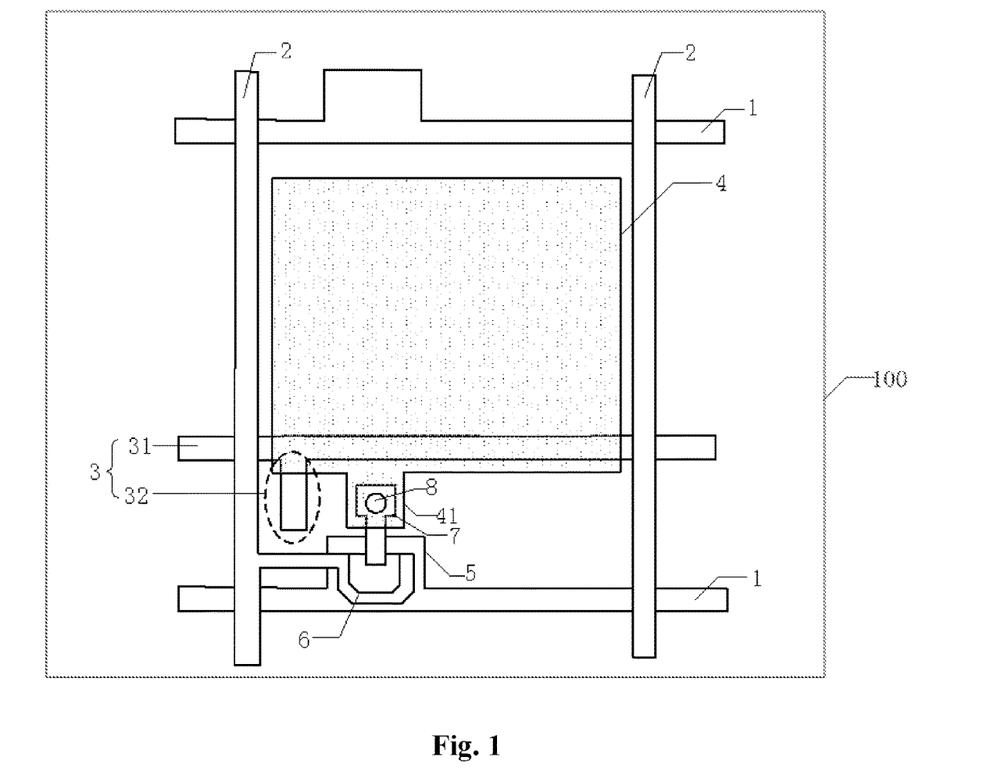
FIG. 1 is a top view of an array substrate according to one embodiment of the present disclosure.
Figure 2:
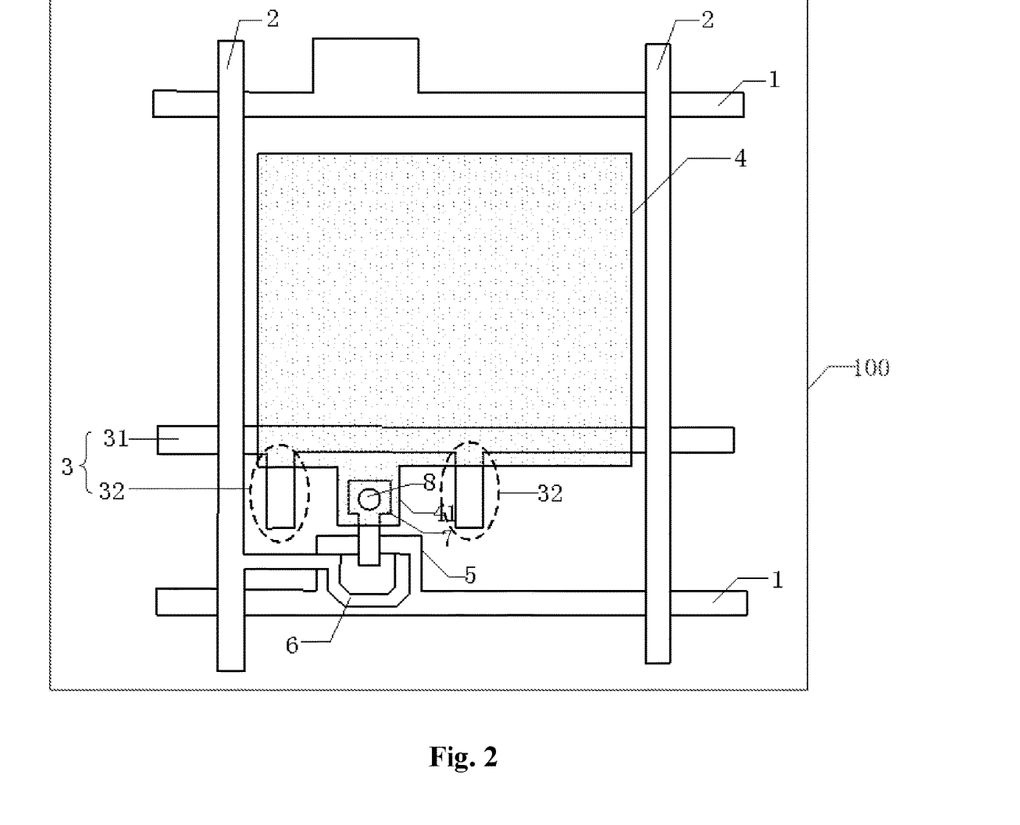
FIG. 2 is another top view of the array substrate according to one embodiment of the present disclosure.
Figure 3:
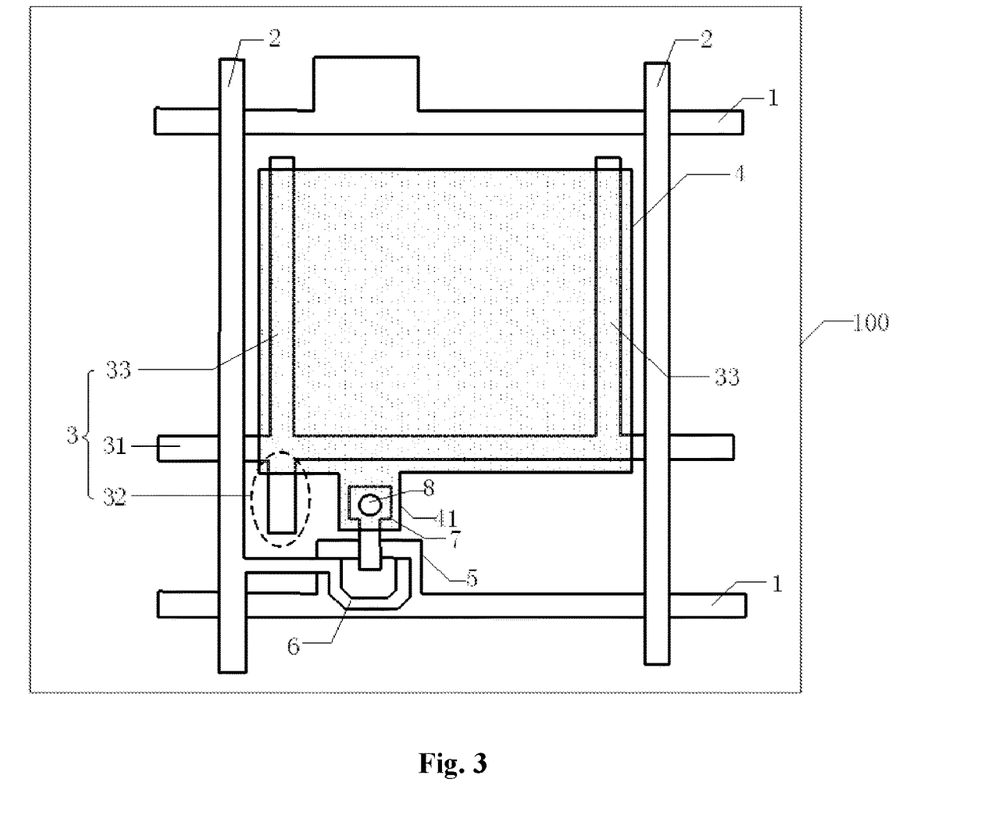
FIG. 3 is yet another top view of the array substrate according to one embodiment of the present disclosure.
Figure 4:
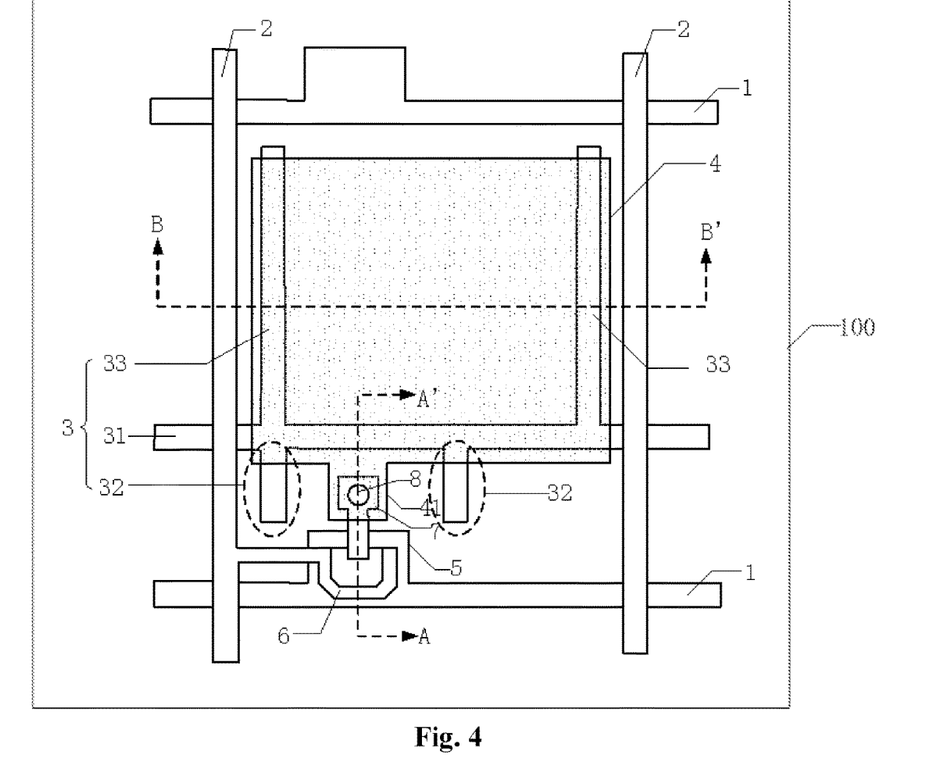
FIG. 4 is still yet another top view of the array substrate according to one embodiment of the present disclosure.

It should be appreciated that, as the first secondary electrode line 32 is located between the via-hole 8 and the data line 2, and the via-hole 8 is located between the primary electrode line 31 and the gate line 1, the first secondary electrode line 32 is arranged at a side of the primary electrode line 31, i.e., at the side of the primary electrode line 31 adjacent to the TFT (a lower side as shown in the figures). In addition, the number of the first secondary electrode lines 32 is not limited to one as shown in FIGS. 1 and 3, or two as shown in FIGS. 2 and 4. Actually, the number of the first secondary electrode lines may be set in accordance with the practical need, which is not particularly defined herein.

According to the embodiments of the present disclosure, the array substrate includes: the base substrate; the plurality of gate lines, the plurality of data lines and the plurality of common electrode lines arranged on the base substrate; the pixel electrode arranged at each region defined by two adjacent gate lines and two adjacent data lines; and the TFT arranged at the position in proximity to the junction between each of the gate lines and the corresponding data line. The drain electrode of the TFT is electrically connected to the pixel electrode through the via-hole. Each common electrode line includes the primary electrode line extending in the direction identical to the extension direction of the gate line, and the secondary electrode line connected vertically to the primary electrode line. The secondary electrode line includes at least one first secondary electrode line arranged between the via-hole and the data line. The via-hole is arranged between the primary electrode line and the gate line. Through the first secondary electrode line arranged between the via-hole and the data line in the array substrate, it is able to prevent a voltage across the connection portion of the pixel electrode from being adversely affected by the signal from the data line, thereby to improve the display quality.

During the implementation, in order to prevent the voltage across the connection portion of the pixel electrode from being adversely affected by the signal from the data line, as shown in FIGS. 1 to 4, the first secondary electrode line 32 may be arranged between the via-hole 8 and the data line 2 nearest to one side of the via-hole 8 (i.e., the left side of the via-hole 8 as shown in these figures), and/or as shown in FIGS. 2 and 4, the first secondary electrode line 32 is arranged between the via-hole 8 and a data line 2 which is at another side of the via-hole 8 (i.e., the right side of the via-hole 8 as shown in these figures) and opposite to the data line nearest to the one side of the via-hole 8.

For both of the above two arrangement modes of the first secondary electrode line, it is able to prevent the voltage across the connection portion of the pixel electrode form being adversely affected by the signal from the data line or any other signals.

During the implementation, in order to facilitate the arrangement of lines and simplify the manufacture process, as shown in FIGS. 1 to 4, the first secondary electrode line 32 may extend in a direction identical to an extension direction of the data line 2 (e.g., the first secondary electrode line 32 may extend downward along the data line 2 as shown in these figures).

Furthermore, during the implementation, as shown in FIGS. 1 to 4, the first secondary electrode line 32 may have a length greater than a distance between a center of the via-hole 8 and the primary electrode line 31, so as to prevent the voltage across the connection portion of the pixel electrode from being adversely affected by the signal from the data line in a better manner.

During the implementation, for the arrangement of the first secondary electrode line, as shown in FIGS. 2 and 4, in the case that there are two first secondary electrode lines 32, the two first secondary electrode lines 32 may be arranged at two sides of the via-hole 8 respectively, i.e., at a left side and a right side of the via-hole 8 respectively. A distance between one of the first secondary electrode lines 32 and the center of the via-hole 8 may be equal to a distance between the other one of the first secondary electrode lines 32 and the center of the via-hole 8.

During the implementation, as shown in FIGS. 3 and 4, the first secondary electrode line may further include at least one second secondary electrode line 33 arranged at an edge region of the pixel electrode 4. Due to the arrangement of the second secondary electrode line 33, a storage capacitor may be formed between the second secondary electrode line 33 and the pixel electrode 4, so as to increase a storage capacitance of a pixel of a liquid crystal device.

It should be appreciated that, two second secondary electrode lines are shown in each of FIGS. 3 and 4. One of the two second secondary electrode lines 33 is arranged at a left end of the pixel electrode 4, and the other is arranged at a right end of the pixel electrode 4. An orthogonal projection of each of the two second secondary electrode lines 33 onto the base substrate may partially overlap an orthogonal projection of the pixel electrode 4 onto the base substrate. In addition, the second secondary electrode line 33 may be arranged at the other side of the primary electrode line 31, i.e., at a side of the primary electrode line 31 away from the TFT (an upper side as shown in these figures). The second secondary electrode line 33 and the first secondary electrode line 32 may be arranged at two sides of the primary electrode line 31 respectively.

During the implementation, because the second secondary electrode line 33 and the first secondary electrode line 32 are arranged at two sides of the primary electrode line 31 respectively, the second secondary electrode line 33 and the first secondary electrode line 32 may be arranged parallel to each other or in an identical straight line. In other words, the second secondary electrode line 33 may also extend in a direction identical to the extension direction of the data line 2 (e.g., the second secondary electrode line 33 may extend upward along the data line 2 as shown in the figures). As shown in FIGS. 2 and 4, the second secondary electrode line 33 on the left may be located in a straight line identical to the first secondary electrode line 32 on the right.

During the implementation, as shown in FIGS. 1 to 4, the primary electrode line 31 may be formed integrally with the secondary electrode line, i.e., the primary electrode line 31 may be formed integrally with the first secondary electrode line 32, or the primary electrode line 31 may be formed integrally with the second secondary electrode line 33. In this way, it is able to form a pattern of the primary electrode line and the secondary electrode line through a single patterning process, thereby to simplify the manufacture process and reduce the manufacture cost.

Figure 5:
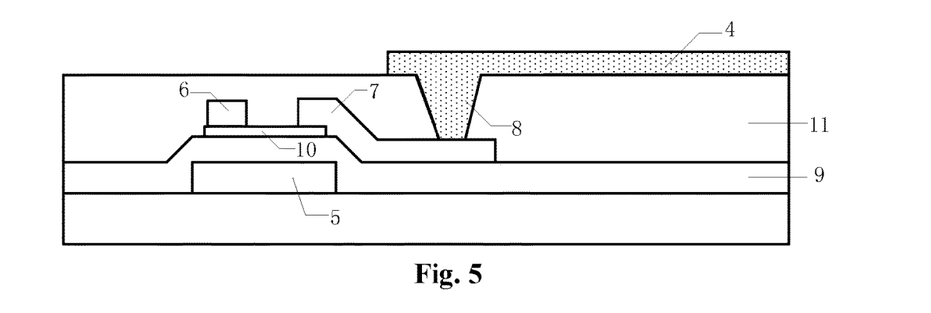
FIG. 5 is a sectional view of the array substrate along a line A-A' in FIG. 4.
Figure 6:
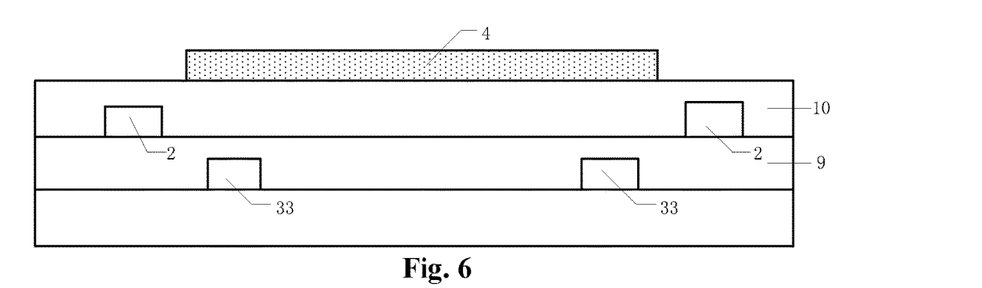
FIG. 6 is a sectional view of the array substrate along a line B-B' in FIG. 4.

During the implementation, as shown in FIGS. 5 and 6, usually the array substrate may further include any other layers, e.g., a gate insulation layer 9, an active layer 10 and a passivation layer 11, and the via-hole 8 may be formed in the passivation layer 11. These layers may be implemented in various ways, which will not be particularly defined herein.

In the embodiments of the present disclosure, the common electrode line 3 may also be a storage electrode line.

Figure 7:
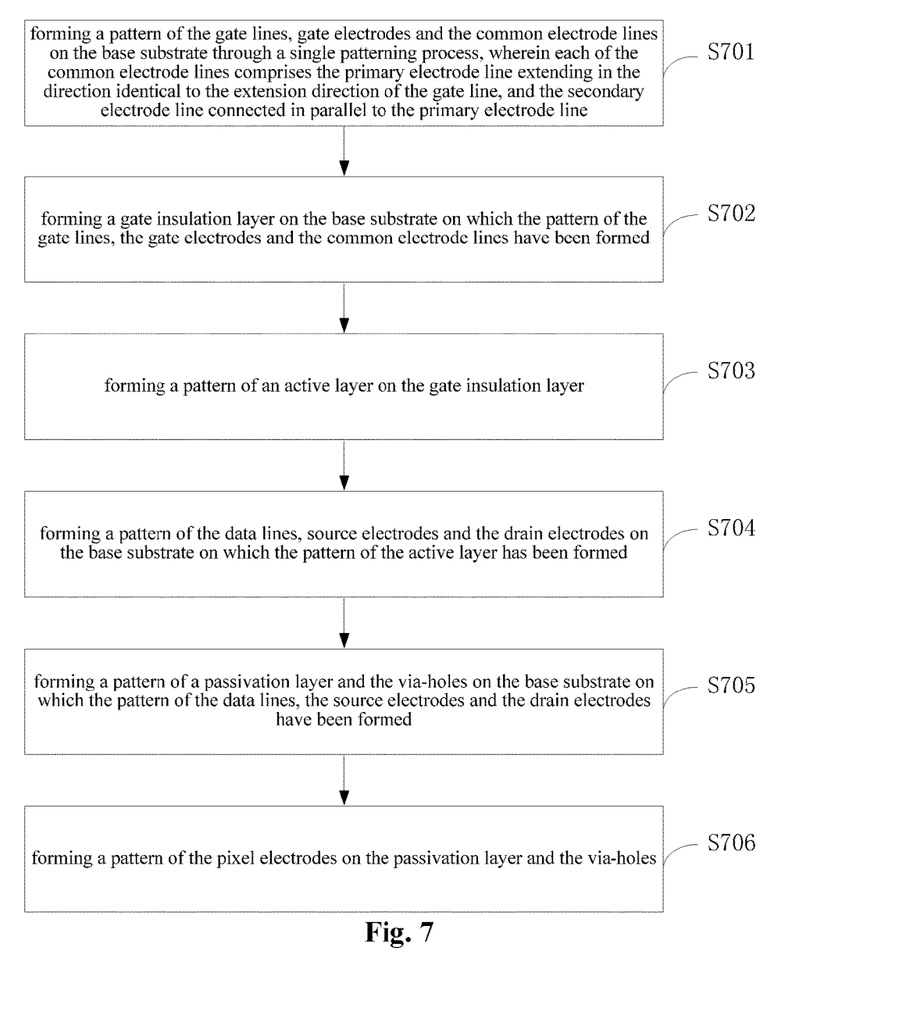
FIG. 7 is a flow chart of a method for manufacturing the array substrate according to one embodiment of the present disclosure.

The present disclosure further provides in some embodiments a method for manufacturing the array substrate which, as shown in FIG. 7, includes the following steps.

Step S701: forming a pattern of the gate lines, gate electrodes and the common electrode lines on the base substrate through a single patterning process, wherein each of the common electrode lines comprises the primary electrode line extending in the direction identical to the extension direction of the gate line, and the secondary electrode line connected vertically to the primary electrode line.

During the implementation, a first metal layer may be deposited onto the base substrate through sputtering, and a photoresist may be applied onto the first metal layer. Next, the photoresist may be exposed and developed, and the first metal layer may be etched so as to form the pattern of the gate lines, the gate electrodes and the common electrode lines. Each of the common electrode lines comprises the primary electrode line extending in the direction identical to the extension direction of the gate line and the secondary electrode line connected vertically to the primary electrode line. The secondary electrode line may include a pattern of a first secondary electrode line and/or a second secondary electrode line. The first metal layer may be made of a material such as Cu, Al, Mo, Ti, Cr or W, or an alloy thereof. The gate line may be of a single-layered structure, or a multi-layered structure such as Mo/Al/Mo, Ti/Cu/Ti or Mo/Ti/Cu.

Step S702: forming a gate insulation layer on the base substrate on which the pattern of the gate lines, the gate electrodes and the common electrode lines have been formed.

During the implementation, the gate insulation layer may be deposited through Plasma Enhanced Chemical Vapor Deposition (PECVD) onto the base substrate on which the pattern of the gate lines, the gate electrodes and the common electrode lines have been formed. The gate insulation layer may be made of a material such as silicon nitride (SiN) or silicon oxide (SiOx), and it may be of a single-layered structure, or a multi-layered structure such as SiN/SiOx.

Step S703: forming a pattern of an active layer on the gate insulation layer.

During the implementation, a semiconductor layer may be deposited onto the gate insulation layer. The semiconductor layer may be made of amorphous silicon (a-Si), poly silicon (p-Si), or an oxide semiconductor. To be specific, an a-Si layer and an n+ a-Si layer may be deposited through PECVD, or an indium gallium zinc oxide (IGZO) layer may be deposited through sputtering, and then a photoresist may be applied onto the above layer. Next, the photoresist may be exposed and developed, and then above layer may be etched so as to form the pattern of the active layer.

Step S704: forming a pattern of the data lines, source electrodes and the drain electrodes on the base substrate on which the pattern of the active layer has been formed.

During the implementation, a second metal layer may be deposited through sputtering onto the base substrate on which the pattern of the active layer has been formed, and a photoresist may be applied onto the second metal layer. Next, the photoresist may be exposed and developed, and the second metal layer may be etched, so as to form the pattern of the data lines, the source electrodes and the drain electrodes. The second metal layer may be made of a material such as Cu, Al, Mo, Ti, Cr or W, or an alloy thereof.

Step S705: forming a pattern of a passivation layer and the via-holes on the base substrate on which the pattern of the data lines, the source electrodes and the drain electrodes have been formed.

During the implementation, the passivation layer, e.g., a SiN layer, may be deposited through PECVD onto the base substrate on which the pattern of the data lines, the source electrodes and the drain electrodes have been formed, and then a photoresist may be applied onto the passivation layer. Next, the photoresist may be exposed and developed, and the passivation layer may be etched so as to form the pattern of the via-holes and thereby expose the drain electrodes. The passivation layer may be made of an inorganic material, e.g., SiN.

Step S706: forming a pattern of the pixel electrodes on the passivation layer and the via-holes.

During the implementation, a conductive material layer made of a transparent metal oxide may be deposited onto the passivation layer and the via-holes through sputtering, and then a photoresist may be applied onto the conductive material layer. Next, the photoresist may be exposed and developed, and the conductive material layer may be etched so as to form the pattern of the pixel electrodes. The pixel electrodes may be made of indium tin oxide (ITO), indium zinc oxide (IZO) or any other conductive material of transparent metal oxide.

The array substrate may be manufactured through the above-mentioned Steps S701 to S706.

Based on an identical inventive concept, the present disclosure further provides in some embodiments a display device including the above-mentioned array substrate. The display device may be any product or member having a display function, such as a mobile phone, a flat-panel computer, a television, a display, a laptop computer, a digital photo frame or a navigator. Any other indispensable components of the display device are known in the art, and thus will not be particularly defined herein. The implementation of the display device may refer to the implementation of the array substrate, and thus will not be particularly defined herein.

According to the array substrate, the method for manufacturing the array substrate, the display panel and the display device in the embodiments of the present disclosure, the array substrate includes: the base substrate; the plurality of gate lines, the plurality of data lines and the plurality of common electrode lines arranged on the base substrate; the pixel electrode arranged at each region defined by two adjacent gate lines and two adjacent data lines; and the TFT arranged at the position in proximity to the junction between each of the gate lines and the corresponding data line. The drain electrode of the TFT is electrically connected to the pixel electrode through the via-hole. Each common electrode line includes the primary electrode line extending in the direction identical to the extension direction of the gate line, and the secondary electrode line connected vertically to the primary electrode line. The secondary electrode line includes at least one first secondary electrode line arranged between the via-hole and the data line. The via-hole is arranged between the primary electrode line and the gate line. Through the first secondary electrode line arranged between the via-hole and the data line in the array substrate, it is able to prevent a voltage across the connection portion of the pixel electrode from being adversely affected by the signal from the data line, thereby to improve the display quality.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising: a base substrate; a plurality of gate lines, a plurality of data lines and a plurality of common electrode lines arranged on the base substrate; a pixel electrode arranged at each region defined by adjacent gate lines and adjacent data lines; and a thin film transistor (TFT) arranged at a position in proximity to a junction between each of the gate lines and the corresponding data line, wherein a drain electrode of the TFT is electrically connected to the pixel electrode through a via-hole, wherein each of the common electrode lines comprises a primary electrode line extending in a direction identical to an extension direction of the gate line, and a secondary electrode line connected vertically to the primary electrode line;

the secondary electrode line comprises at least one first secondary electrode line arranged between the via-hole and the data line;

the via-hole is arranged between the primary electrode line and the gate line;

the primary electrode line comprises a first portion, a second portion, and a third portion, the plurality of data lines comprises a first data line and a second data line adjacent to the first data line, the first portion is arranged at a side of the first data line distal to the pixel electrode, the second portion is arranged at a side of the second data line distal to the pixel electrode, the third portion is arranged between the first portion and the second portion and is in direct physical contact with both the first portion and the second portion, the third portion is configured to span the pixel electrode, and the first portion, the second portion, and the third portion are arranged in one straight line;

the first secondary electrode line consists of a fourth portion and a fifth portion, the fourth portion is in direct physical contact with the third portion, the fifth portion is arranged at a side of the fourth portion distal to the primary electrode line, the fifth portion is in direct physical contact with the fourth portion, the fourth portion and the fifth portion are arranged in another one straight line, an orthogonal projection of the fourth portion onto the base substrate is located within an orthogonal projection of the pixel electrode onto the base substrate, and an orthogonal projection of the fifth portion onto the base substrate is located outside of the orthogonal projection of the pixel electrode onto the base substrate; and an orthogonal projection of the third portion onto the base substrate overlaps the orthogonal projection of the pixel electrode onto the base substrate.

2. The array substrate according to claim 1, wherein
the first secondary electrode line is arranged between the via-hole and a data line nearest to one side of the via-hole; or
the first secondary electrode line is arranged between the via-hole and a data line which is at another side of the via-hole and opposite to the data line nearest to the one side of the via-hole; or
one or more of the first secondary electrode lines are arranged between the via-hole and the data line nearest to the one side of the via-hole, and the remaining first secondary electrode lines are arranged between the via-hole and a data line which is at another side of the via-hole and opposite to the data line nearest to the one side of the via-hole.

3. The array substrate according to claim 2, wherein the first secondary electrode line extends in a direction identical to an extension direction of the data line.

4. The array substrate according to claim 3, wherein the first secondary electrode line has a length greater than a distance between a center of the via-hole and the primary electrode line.

5. The array substrate according to claim 4, wherein in the case that there are two first secondary electrode lines, the two first secondary electrode lines are arranged at two sides of the via-hole respectively, and a distance between one of the two first secondary electrode lines and the center of the via-hole is equal to a distance between the other one of the first secondary electrode lines and the center of the via-hole.

6. The array substrate according to claim 1, wherein the secondary electrode line further comprises at least one second secondary electrode line arranged at an edge region of the pixel electrode, and the second secondary electrode line and the first secondary electrode line are arranged at two sides of the primary electrode line respectively.

7. The array substrate according to claim 6, wherein the second secondary electrode line and the first secondary electrode line are arranged parallel to each other or in an identical straight line.

8. The array substrate according to claim 1, wherein the primary electrode line and the secondary electrode line are formed integrally.

9. A display panel comprising the array substrate according to claim 1.

10. The display panel according to claim 9, wherein
the first secondary electrode line is arranged between the via-hole and a data line nearest to one side of the via-hole; or
the first secondary electrode line is arranged between the via-hole and a data line which is at another side of the via-hole and opposite to the data line nearest to the one side of the via-hole; or
one or more of the first secondary electrode lines are arranged between the via-hole and the data line nearest to the one side of the via-hole, and the remaining first secondary electrode lines are arranged between the via-hole and a data line which is at another side of the via-hole and opposite to the data line nearest to the one side of the via-hole.

11. The display panel according to claim 10, wherein the first secondary electrode line extends in a direction identical to an extension direction of the data line.

12. The display panel according to claim 11, wherein the first secondary electrode line has a length greater than a distance between a center of the via-hole and the primary electrode line.

13. The display panel according to claim 12, wherein in the case that there are two first secondary electrode lines, the two first secondary electrode lines are arranged at two sides of the via-hole respectively, and a distance between one of the two first secondary electrode lines and the center of the via-hole is equal to a distance between the other one of the first secondary electrode lines and the center of the via-hole.

14. The display panel according to claim 9, wherein the secondary electrode line further comprises at least one second secondary electrode line arranged at an edge region of the pixel electrode, and the second secondary electrode line and the first secondary electrode line are arranged at two sides of the primary electrode line respectively.

15. The display panel according to claim 14, wherein the second secondary electrode line and the first secondary electrode line are arranged parallel to each other or in an identical straight line.

16. The display panel according to claim 9, wherein the primary electrode line and the secondary electrode line are formed integrally.

17. A display device comprising the display panel according to claim 9.

18. The display device according to claim 17, wherein
the first secondary electrode line is arranged between the via-hole and a data line nearest to one side of the via-hole; or
the first secondary electrode line is arranged between the via-hole and a data line which is at another side of the via-hole and opposite to the data line nearest to the one side of the via-hole; or
one or more of the first secondary electrode lines are arranged between the via-hole and the data line nearest to the one side of the via-hole, and the remaining first secondary electrode lines are arranged between the via-hole and a data line which is at another side of the via-hole and opposite to the data line nearest to the one side of the via-hole.

19. The display device according to claim 18, wherein the first secondary electrode line extends in a direction identical to an extension direction of the data line.

20. A method for manufacturing the array substrate according to claim 1, comprising:
forming a pattern of the gate lines, gate electrodes and the common electrode lines on the base substrate through a single patterning process, wherein each of the common electrode lines comprises the primary electrode line extending in the direction identical to the extension direction of the gate line, and a secondary electrode line connected vertically to the primary electrode line;
forming a gate insulation layer on the base substrate on which the pattern of the gate lines, the gate electrodes and the common electrode lines have been formed;
forming a pattern of an active layer on the gate insulation layer;
forming a pattern of the data lines, source electrodes and the drain electrodes on the base substrate on which the pattern of the active layer has been formed;
forming a pattern of a passivation layer and the via-holes on the base substrate on which the pattern of the data lines, the source electrodes and the drain electrodes have been formed; and
forming a pattern of the pixel electrodes on the passivation layer and the via-holes.

* * * * *